United States Patent [19]

Ogasawara et al.

[11] Patent Number: 5,591,980
[45] Date of Patent: Jan. 7, 1997

[54] BI-AXIAL-TILTING SPECIMEN FINE MOTION DEVICE AND METHOD OF CORRECTING IMAGE SHIFTING

[75] Inventors: Mitsuo Ogasawara, Hitachinaka; Hiroyuki Kobayashi, Mito; Morioki Kubozoe, Hitachinaka, all of Japan

[73] Assignees: Hitachi, Ltd., Tokyo; Hitachi Science Systems, Ltd., Hitachinaka, both of Japan

[21] Appl. No.: 492,878

[22] Filed: Jun. 20, 1995

[30] Foreign Application Priority Data

Jun. 29, 1994  [JP]  Japan .................... 6-148109

[51] Int. Cl.⁶ ............................................ H01J 37/20
[52] U.S. Cl. ........................... 250/442.11; 250/440.11
[58] Field of Search ..................... 250/442.11, 440.11, 250/310.311

[56] References Cited

U.S. PATENT DOCUMENTS 4,710,633  12/1987  Suzuki ................. 250/442.11
4,950,909   8/1990  Yokoto et al. ......... 250/442.11

OTHER PUBLICATIONS

LM1851 Ground Fault Interrupter data sheet, National Semiconductor Application Specific Analog Products Data Book, pp. 4–233 to 4–239 (1995) no month.

*Primary Examiner*—Jack I. Berman
*Assistant Examiner*—Kiet T. Nguyen
*Attorney, Agent, or Firm*—Kenyon & Kenyon

[57] ABSTRACT

In a eucentric side entry goniometer stage used in an electron microscope controlled in five-axes of specimen positions (x, y, z) and specimen tilt angles ($\theta_x$, $\theta_y$), image shifting during tilting a specimen is automatically corrected. Assuming that the coordinates of an observed point are (x, y, z), shifting of observed image is automatically corrected by calculating correction values of image shifting $\Delta y$ and $\Delta z$ using a calculator based on the following equations and by shifting the observed point to a coordinates (x, y−$\Delta y$, z−$\Delta z$) using a specimen position and tilt angle controller when the tilt angle $\theta_y$ is varied from $\theta_{y1}$ to $\theta_{y2}$ wherein $\Delta y = y(1 - \cos\theta_{y2}/\cos\theta_{y1})$ $\Delta z = y(\sin\theta_{y2} - \sin\theta_{y1})/\cos\theta_{y1}$.

10 Claims, 6 Drawing Sheets

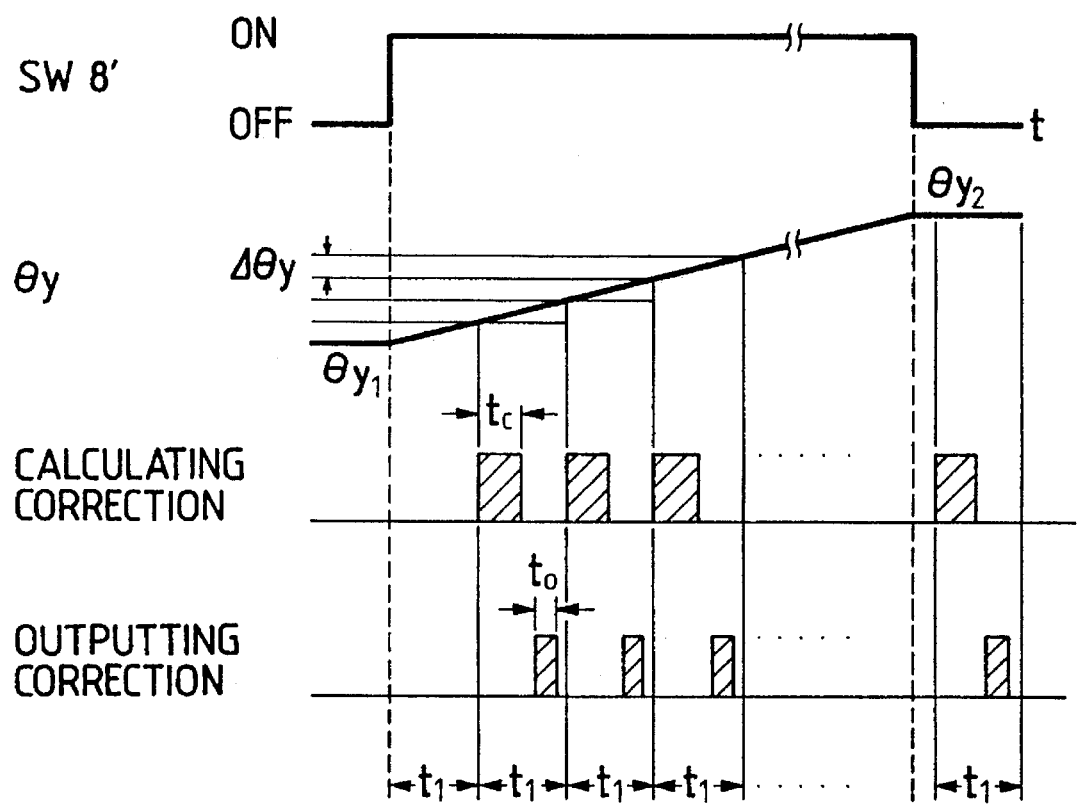

FIG. 8A

| SPECIMEN POSITION | |
|---|---|
| x | 200 |
| y | 619 |

SPECIMEN TILT ANGLE
$\theta x$     10.0°
$\theta y$     40.0°

SPECIMEN POSITION AT 0°
$x_0$     210
$y_0$     808

FIG. 8B

SPECIMEN POSITION
x     221
y     759

SPECIMEN TILT ANGLE
$\theta x$     10.0°
$\theta y$     40.0°

SPECIMEN POSITION AT 0°
$x_0$     210
$y_0$     991

FIG. 8C

SPECIMEN POSITION
x     221
y     931

SPECIMEN TILT ANGLE
$\theta x$     15.0°
$\theta y$     20.0°

SPECIMEN POSITION AT 0°
$x_0$     210
$y_0$     991

BI-AXIAL-TILTING SPECIMEN FINE MOTION DEVICE AND METHOD OF CORRECTING IMAGE SHIFTING

BACKGROUND OF THE INVENTION

The present invention relates to a bi-axial tilting specimen fine motion device in an electron microscope, and more particularly to a eucentric side entry bi-axial-tilting specimen fine motion device capable of automatically correcting image shifting during tilting a specimen.

A common bi-axial-tilting specimen fine motion device (goniometer stage) in an electron microscope is a eucentric side entry goniometer stage.

FIG. 3 is a cross-sectional view showing the outline of a eucentric side entry goniometer stage. A specimen 3 is mounted on a specimen holder 20 which becomes a specimen stage. The specimen holder 20 is inserted inside a fine motion cylinder 30 universally pivotable with a sliding surface of a spherical part 29 in a vacuum sealed state to a main body 28 by an O-ring 27 using a drive spring part 25, a horizontal drive screw 26, a drive spring part and a vertical drive screw, not shown, provided in positions in the direction perpendicular to the plane of the figure which are provided in a tilt base body 24 rotated by a tilt drive worm gear 23, and is loaded inside a space of an electron beam passage 32 in a vacuum sealed state by an O-ring 31. On the other hand, the specimen holder 20 inserted into the fine motion cylinder 30 is linked to a fine motion shaft 16 jointed to a horizontal drive shaft 13 slidable in a vacuum sealed state by an O-ring 33 as shown in the figure.

Therefore, when the horizontal drive shaft 13 is driven, the specimen 3 can be moved in the y-direction through the fine motion shaft 16 and the specimen holder 20. On the other hand, when the horizontal screw 26 is driven, the specimen 3 can be finely moved in the x-direction because the specimen holder 20 is pivotally moved together with the fine motion cylinder 30 about a center point K of the spherical part 29 which functions as a fulcrum of pivotal movement, i.e., a point of support, of the specimen holder 20. The top front portion of the specimen holder 20 contacting to the fine motion shaft 16 is of a spherical-shape having the point K as the center. The top front portion of the fine motion shaft 16 contacting to the specimen holder is of a spherical-shape having the contact portion of the horizontal drive shaft 13 and the fine motion shaft 16 as the center. Therefore, the top front portion of the specimen holder 20 and the top front portion of the fine motion shaft 16 always contact to one point on a tilt shaft 17 of the tilt base body 24 independently of the fine motion in the x-direction. Let the one point be a point P. The point P moves on the shaft 17 in the range of ±1 mm at maximum with movement of the horizontal drive shaft 13. Therefore, the radius of the sphere in the top front portion of the specimen holder 20 is formed to be equal to the distance between the point P and the point K when the point P is in the middle point of the range of its movement.

By driving the horizontal drive screw, not shown, the specimen holder 20 can be pivotally moved around the point K of the spherical portion 29 as a point of support through the fine motion cylinder 30 to finely move the specimen 3 in the z-direction.

Further, by rotating the tilt base body 24 with driving the tilt drive worm gear 23, the specimen 3 can be tilted to the optical axis in the $θ_x$-direction by rotating the specimen holder 20 through the fine motion cylinder 30.

In the specimen holder 20, as shown in a plan view of FIG. 4A and a cross-sectional view of FIG. 4B, there is installed a specimen table 35 rotatable around an axis intersecting the center axis of the specimen holder 20 (that is, the x-axis) at right angle. By rotating the specimen table 35 with an external operation, the specimen 3 can be tilted in the $θ_y$-direction.

The operational principle of a eucentric side entry goniometer stage will be described, referring to FIG. 5. The reference character 1 indicates the optical axis of an electron beam, and the reference character 3 indicates a specimen. An axis 17 indicates the tilt axis for the tilt angle $θ_x$ in the x-direction. The axis 17 is adjusted so as to intersect the optical axis 1. A point A is the intersection and an observed point. The reference character 14 is the reference line for tilt angle $θ_x$ of 0°. An axis 12 is the center axis of the specimen holder 20 mounting the specimen 3. A point K is the intersection of the tilt axis 17 and the center axis of the specimen holder 12. When the axis 12 moves in the direction indicated by an arrow, the specimen 3 is moved toward the direction opposite to the arrow direction. An axis 13 is the axis of the specimen drive shaft in the y-direction, and substantially agrees with the axis 17.

The fine motion shaft 16 is a part to mechanically link the specimen drive shaft 13 in the y-direction with the specimen holder 20, and a driving force transmitting part to move the specimen 3 in the y-direction. The mechanical contact portion of the fine motion shaft 16 and the specimen holder 20 coincides with the point P in the tilt axis 17 as have been described in FIG. 3. By moving the center axis of the specimen holder 20 in the z-direction shown in the arrow, the specimen can be moved toward the direction opposite to the arrow direction perpendicular to the plane formed by the axis 15 and the axis 12. Further, the specimen 3 can be tilted around the tilt axis 15 for tilt angle $θ_y$ in the y-direction as a rotating center axis, FIG. 5 shows a case where the tilt angle of $θ_y$ in this direction is 0° (zero degree). The axis 12 is a reference line for $θ_y=0°$.

In this case, by making the specimen superposed on the point A with adjustment of the z-direction, since the point A is on the tilt axis 17 for $θ_x$, the specimen does not shift from the observed point A even if the tilt angle $θ_x$ is varied, that is, the specimen does not shift from the field of observation in principle. The point (0, 0) in the figure indicates the intersection of the axis 12 and the axis 15 and the point of origin of the coordinate system of x, y for small movement of the specimen. By making the specimen superposed on the point A through varying the small movement of the specimen x, y and adjusting a position in the z-direction in an arbitrary position, the specimen does not shift out of the field of observation even if the tilt angle $θ_x$ is varied. This is the reason to be called as eucentric goniometer. This performance can be realized in that the tilt axis 17 for tilt angle $θ_x$ can be set as a fixed axis independently of the movement of the specimen in the x-direction.

However, since the construction is formed such that the tilt axis 15 for tilt angle $θ_y$ in the y-direction moves together with the specimen motion y, the tilt axis 15 cannot be made to coincide with the specimen at the point A even if adjusting in the z-direction is performed except when y=0, that is, the tilt axis 15 intersects the point A. Therefore, if the specimen is tilted in the $θ_y$-direction, the specimen shifts out of the field of observation.

In a bi-axial-tilting specimen fine motion device such as a eucentric side entry goniometer stage mounted in an electron microscope, a position being observed does not always agree with the specimen tilt axis. If the specimen is tilted during observation, the specimen position being observed will shift out of the field of observation.

Therefore, it is required to manually correct the displacement of the specimen every time the specimen is tilted while the image of the specimen is being observed using a specimen fine motion device; that is a very inconvenient operation.

SUMMARY OF THE INVENTION

The present invention provides a method of automatically correcting the image shifting when a specimen is tilted in a bi-axial-tilting mechanism for specimen in an electron microscope.

CPU control of a specimen fine motion mechanism and a specimen tilting mechanism in an electron microscope is well known. However, the main purpose of the CPU control in the past is to set the field of view to a pre-stored specimen position or a pre-stored specimen tilt angle or to return it to the point of origin.

In the present invention, the relation between the tilt angle of a specimen when the specimen is tilted at an arbitrary position of the specimen and a displacement of the specimen when the specimen is tilted is mathematically obtained, and by using a CPU, the position of the specimen is corrected by controlling the specimen tilting mechanism and the specimen fine motion mechanism controlled by the CPU. In addition to the correction of the planar position of the specimen in the x- and y-directions, the displacement in the z-direction when the specimen is tilted can be also corrected.

A eucentric side entry bi-axial-tilting specimen fine motion device according to the present invention has a specimen holder movable forward and backward in a direction nearly perpendicular to an optical axis and universally pivotable and rotatable around a point of support positioned on the center axis of the specimen holder, a specimen table rotatable provided on the specimen holder, means for controlling specimen position and specimen tilt angle to the optical axis, and a calculating means. In a coordinate system of where an axis intersecting the center axis of the specimen holder at right angle on the specimen holder corresponds to the x-axis, an axis connecting an observed point positioned on the optical axis and the point of support and intersecting the optical axis at right angle corresponding to the y-axis, an axis perpendicular to the x-axis and the y-axis corresponds to the z-axis, a tilt angle of the x-axis to the plane perpendicular to the optical axis is $\theta_x$, a tilt angle to the center axis of the specimen holder in the specimen table being rotatable around the x-axis is $\theta_y$, a coordinate of the observed point having the intersecting point of the center axis of the specimen holder and the x-axis as the point of origin is (x, y, z), when the tilt angle $\theta_y$ is varied from $\theta_{y1}$ to $\theta_{y2}$, shifting of observed image is automatically corrected by calculating correction values of image shifting $\Delta y$ and $\Delta z$ using the calculating means based on the following equations;

$$\Delta y = y(1-\cos\theta_{y2}/\cos\theta_{y1})$$

$$\Delta z = y(\sin\theta_{y2}-\sin\theta_{y1})/\cos\theta_{y1},$$

and by shifting the observed point to a coordinates (x, y−$\Delta y$, z−$\Delta z$) using the specimen position controlling means.

It is preferable that the change in the tilt angle $\theta_y$ and the accompanied adjustment are performed by every increment of the very small change $\Delta\theta_y$. In such a case, the tilt angle $\theta_y$ being varied by a very small value of change $\Delta\theta_y$ step-by-step, at the same time shifting of observed image being automatically corrected by calculating correction values of image shifting $\Delta y$ and $\Delta z$ using the calculating means based on the following equations;

$$\Delta y = y(1-\cos(\theta_{y1}+\Delta\theta_{y1}))/\cos\theta_{y1})$$

$$\Delta z = y(\sin(\theta_{y1}+\Delta\theta_{y1})-\sin\theta_{y1})/\cos\theta_{y1},$$

(In the above equations, $\theta_{y1}$ is the value of $\theta_y$ just before changing the tilt angle $\theta_y$ by the very small value of change $\Delta\theta_{y1}$.) and by shifting the observed point to a coordinates (x, y−$\Delta y$, z−$\Delta z$) using the specimen position controlling means.

In a case where the change in the tilt angle $\theta_y$ and the accompanied adjustment are performed by every increment of the very small change $\Delta\theta_y$, the calculation of $\Delta y$ and $\Delta z$ may be performed using the following equations;

$$\Delta y = y\{1-\cos\Delta\theta_y+(\tan\theta_{y1}\cdot\sin\Delta\theta_y)\}$$

$$\Delta z = y\{\tan\theta_{y1}(\cos\Delta\theta_y-1)+\sin\Delta\theta_y\}.$$

Further, it is preferable that in addition to the position of specimen and the tilt angle of specimen, the true position of the specimen being observed, that is, the position of specimen at the tilt angle of zero is also displayed on the display unit.

Although the main purpose of a specimen fine motion mechanism in an electron microscope is to find out a view to be observed from a specimen, the specimen fine motion mechanism is also used for correcting the shifting of view when the specimen is tilted after selecting the view to be observed. Therefore, the position includes both of the position of the specimen itself and the correction of the shift of the specimen caused by the tilting of the specimen. Further, when the specimen is tilted, the method of correction differs depending on which tilting is performed, the tilting of $\theta_x$ or the tilting of $\theta_y$, and the fine motion of the specimen is also affected by the tilting.

In the present invention, the inter-relation among fine motions of specimen x, y, z and tilt angles of specimen $\theta_x$, $\theta_y$ is obtained as equations, an amount of correction for image shifting at tilting of a specimen is calculated, and the amount of correction for the position of the specimen is performed with a specimen fine motion mechanism. Therefore, shifting of image does not occurs even if the tilting angle of the specimen is changed.

BRIEF DESCRIPTION OF THE DRAWINGS

FIG. 7 is a timing chart showing an embodiment of correction of image shifting when a specimen is tilted by $\theta_y$.

FIGS. 8A, 8B and 8C are views showing display screens of specimen positions and specimen tilt angles.

DETAILED DESCRIPTION

Figure 1:
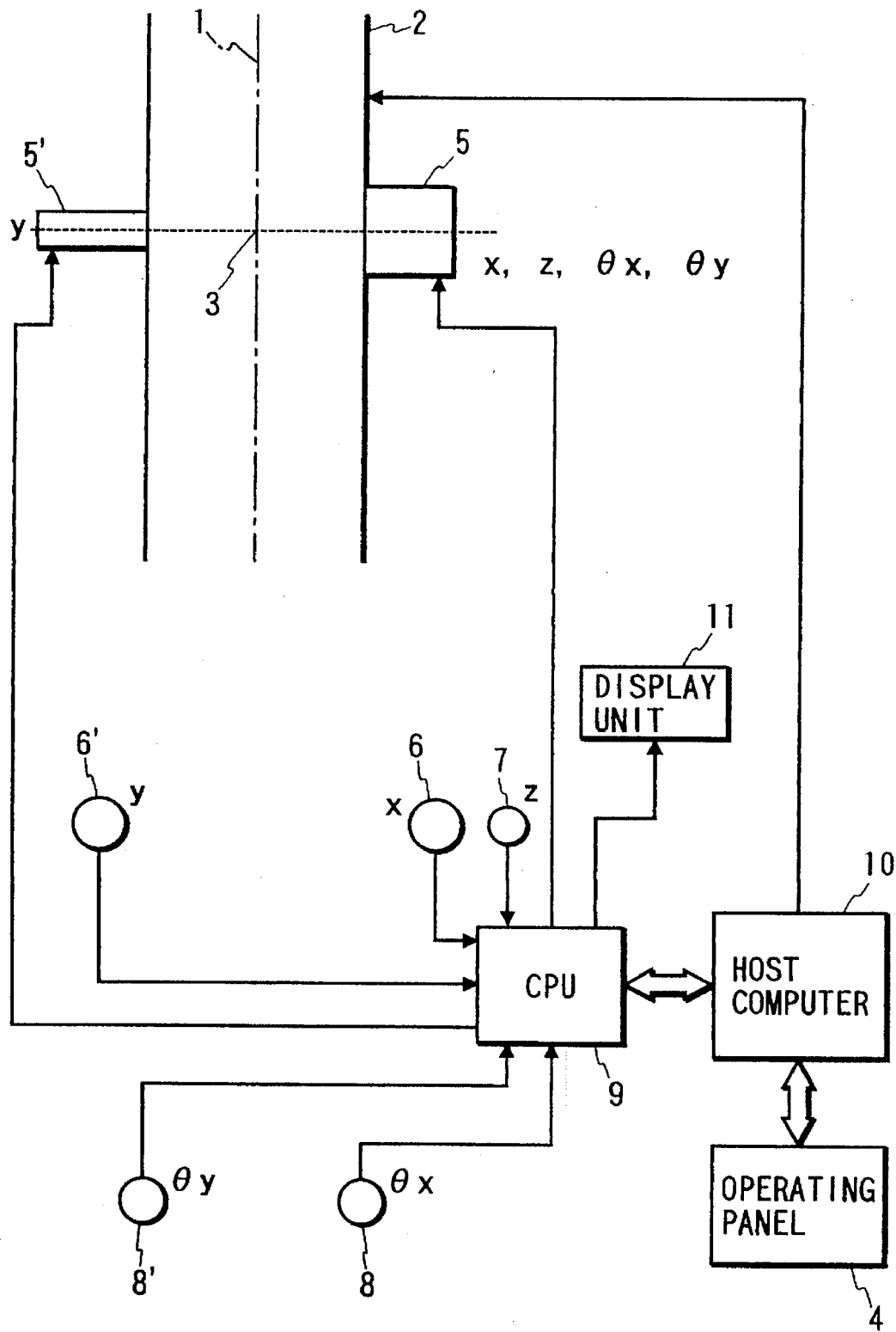
FIG. 1 is a block diagram showing the construction of hardware in accordance with an embodiment of the present invention.

FIG. 1 is a block diagram showing the structure of hardware of an embodiment according to the present invention. The reference character 1 indicates an optical axis of an electron beam, and the reference character 2 indicates a part of a main body. The reference character 3 is a specimen.

Common operation of an electron microscope is performed from an operating panel 4 through a host computer 10. A eucentric side entry goniometer stage 5, 5' has a horizontal direction specimen fine motion (x, y) function, a vertical direction specimen fine motion (z) function and a specimen bi-direction tilting ($\theta_x$, $\theta_y$) function which are controlled by a CPU 9 for controlling the goniometer stage. The reference characters 6, 6' are operating units for finely moving a specimen in the x- and y-directions, and are used for finding a view in the specimen and setting a position of the specimen. The reference character 7 is an operating unit for finely moving the specimen in the z-direction. The reference characters 8, 8' are operating units for tilting the specimen in the bi-direction ($\theta_x$, $\theta_y$).

The CPU 9 for controlling the goniometer stage is connected to a host CPU 10 which controls the operating condition of the electron microscope, for example, the host CPU may automatically control the speeds of the specimen fine motion and the specimen tilting by linking with the magnification of the view. A CPU of more than 16 bit class is used for the host CPU 10 to perform high speed calculations for correcting the movement of the specimen when the specimen is tilted as will be described later.

Figure 5:
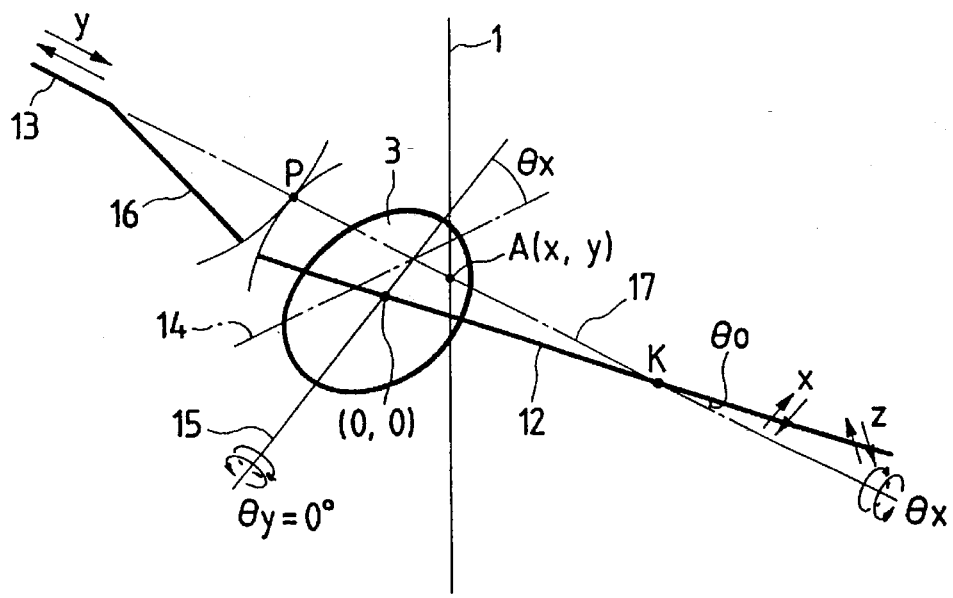
FIG. 5 is a view explaining the mechanical principle of a eucentric side entry goniometer stage.
Figure 6:
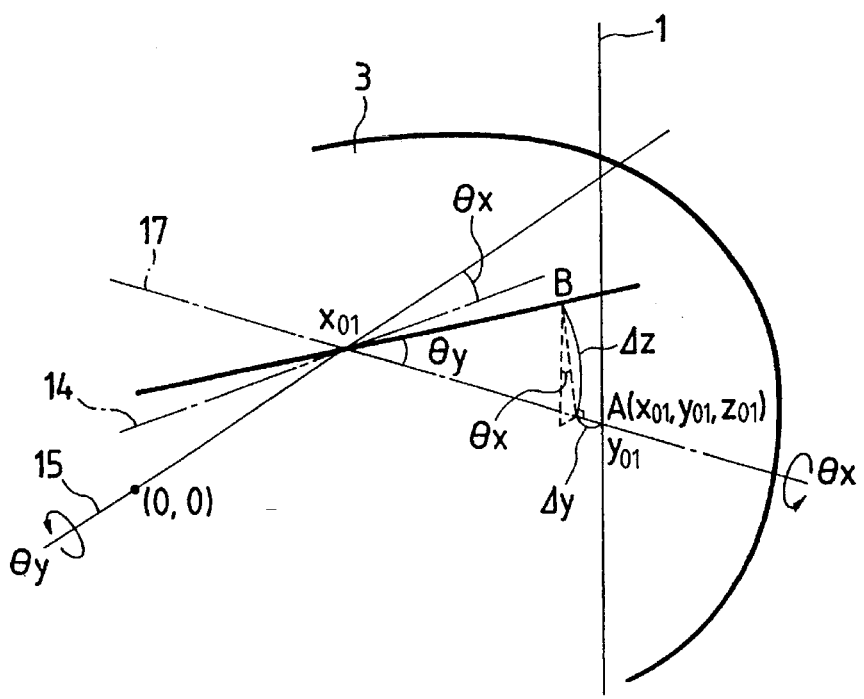
FIG. 6 is an enlarged view showing the main portion of FIG. 5.

FIG. 6 is an enlarged view showing the vicinity of the optical axis of FIG. 5 to quantitatively explain the displacement in the position of the specimen when the specimen is tilted. The reference character 1 is an optical axis. The reference character 3 is a specimen, the reference character 17 is a tilting axis in the x-direction ($\theta_x$-axis), and the reference character 15 is a tilting axis in the y-direction ($\theta_y$-axis). The x-axis for specimen fine motion coincides with the axis 15, and the y-axis coincides with the axis 17. Although the x-axis 15 does not intersect the y-axis 17 at a right angle exactly, the angle $\theta_0$ between the axis 17 and the axis 12 is approximately 1° at maximum and, therefore, it may be considered that the axis 15 and the axis 17 intersect at a right angle.

In the figure, a point (0, 0) is the point of origin for specimen fine motion x, y. Here, it is assumed that the specimen is observed at the position $x=x_{01}$ ($\theta_x=0°$), $y=y_{01}$ ($\theta_y=0°$) with tilt angle of zero degree ($\theta_x=0°$, $\theta_y=0°$). That is, the point A of the intersection of the optical axis 1 and the x-axis is observed. The component $z_O$ of the point A is a value of z when the position ($x_O$, $y_O$) is focused by controlling the z-direction. If the specimen is tilted from this state by $\theta_{x1}$, $\theta_{y1}$, the position being observed is shifted to a point B. The displacement of the point B from the point A is expressed by the following equations.

$$\Delta x = y_{01} \sin\theta_{y1} \cdot \tan\theta_{x1} \quad (1)$$

$$\Delta y = y_{01}(1-\cos\theta_{y1}) \quad (2)$$

$$\Delta z = y_{01} \sin\theta_{y1} \quad (3)$$

By correcting the displacement, the observed position is returned to the point A of the position originally observed.

The coordinates after the correction ($x_1$, $y_1$, $z_1$) becomes as follows.

$$x_1 = x_{01} - \Delta x + (\Delta z)_x = x_{01} \quad (4)$$

$$y_1 = y_{01} - \Delta y = y_{01} \cos\theta_{y1} \quad (5)$$

$$z_1 = z_{01} - \Delta z = z_{01} - y_O \sin\theta_{y1} \quad (6)$$

The value $(\Delta z)_x$ in the equation (4) is a component in the x-direction when z is corrected by the value $\Delta z$, and is equal to the value $\Delta x$. Therefore, when the displacement is corrected by the value $\Delta z$ in the z-direction, the value $\Delta x$ in the x-direction is automatically corrected and, consequently, there is no special correction in the x-direction. In a case where the values $x_{01}$, $y_{01}$ are kept constant and only the tilt angle is changed, it is sufficient to shift the coordinates to the point ($x_1$, $y_1$, $z_1$) expressed by the equations (4) to (6). However, actually, it is common that the tilt angles $\theta_x$, $\theta_y$ are kept constant and another new position on the specimen is observed by operating the specimen moving device.

Let the new position to be observed be ($x_2$, $y_2$). Since the specimen is tilted, correction in the z-direction is required. By correcting in the z-direction in the same way as described above, since the specimen shifts by the value of $(\Delta z)_x$ in the x-direction, the correction for this shifting is required. The resultant coordinates (x, y, z) are as follows.

$$\begin{aligned} x = x_2 - (\Delta z)_x &= x_2 - (y_{02} - y_{01})\sin\theta_{y1} \cdot \tan\theta_{x1} \quad (7) \\ &= x_2 - (y_2 - y_1)\sin\theta_{y1} \cdot \tan\theta_{x1} \\ &\to x_2' - (y_2 - y_1)\sin\theta_{y1} \cdot \tan\theta_{x1} \end{aligned}$$

$$y = y_2 \quad (8)$$

$$\begin{aligned} z = z_1 - \Delta z &= z_1 - (y_{02} - y_{01})\tan\theta_{y1} \quad (9) \\ &= z_1 - (y_2 - y_1)\tan\theta_{y1} \to z_2' \end{aligned}$$

where $x_{02}=x_2$, $y_{02}=y_2/\cos\theta_{y1}$, $y_{01}=y_1/\cos\theta_{y1}$.

Since it is considered that the surface of the specimen is uneven, focusing on the position to be observed with control in the z-direction is required for the last stage. Let the z-coordinate after focusing be $z_2'$, and let the displacement in the z-direction at this time be $h_z$. The amount of the accompanied movement in the x-direction becomes $h_z \tan\theta_{x1}$. Although this value is generally very small, the value corrected with this movement is expressed by $x_2'$.

Assuming that at this new position of the specimen, the specimen is tilted. Since the change in $\theta_x$ is eucentrically performed, shifting of view does not occur. However, since the change in $\theta_y$ causes shifting of view, the shift needs to be corrected. When the value $\theta_y$ is varied from $\theta_{y1}$ to $\theta_{y2}$, the amount of correction required at that time become the following equations (10) to (12) obtained by referring to the equations (1) to (6). The value $\Delta x$ is automatically corrected by correcting the value $\Delta z$ as described above.

$$\Delta x = (\Delta z)_x \quad (10)$$

$$\begin{aligned} \Delta y &= y_{02}(\cos\theta_{y1} - \cos\theta_{y2}) \quad (11) \\ &= y_2(1 - \cos\theta_{y2}/\cos\theta_{y1}) \end{aligned}$$

$$\begin{aligned} \Delta z &= y_{02}(\sin\theta_{y2} - \sin\theta_{y1}) \quad (12) \\ &= y_2(\sin\theta_{y2} - \sin\theta_{y1})/\cos\theta_{y1} \end{aligned}$$

Figure 2:
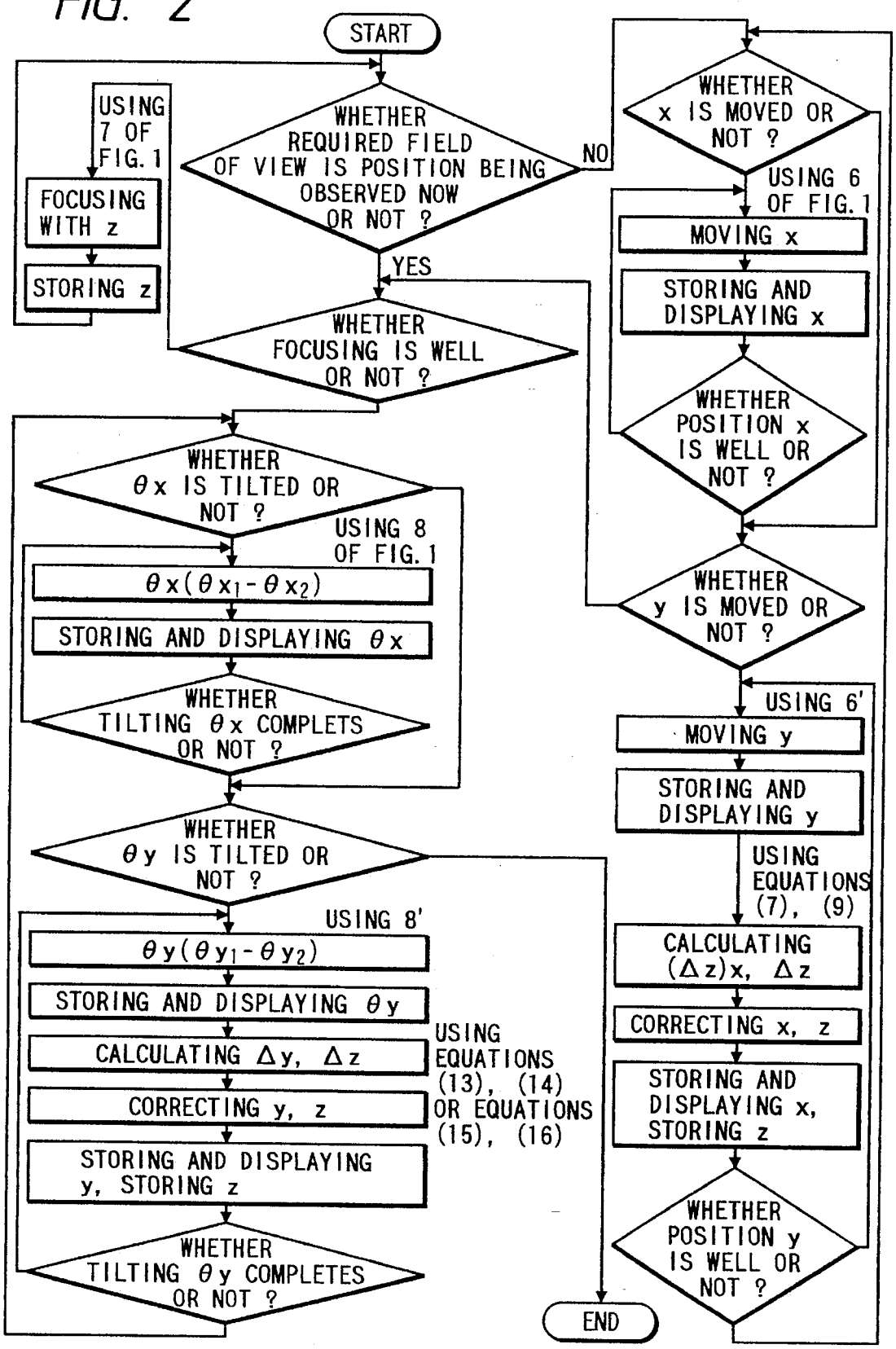
FIG. 2 is a flow chart showing software for an embodiment of the present invention.
Figure 3:
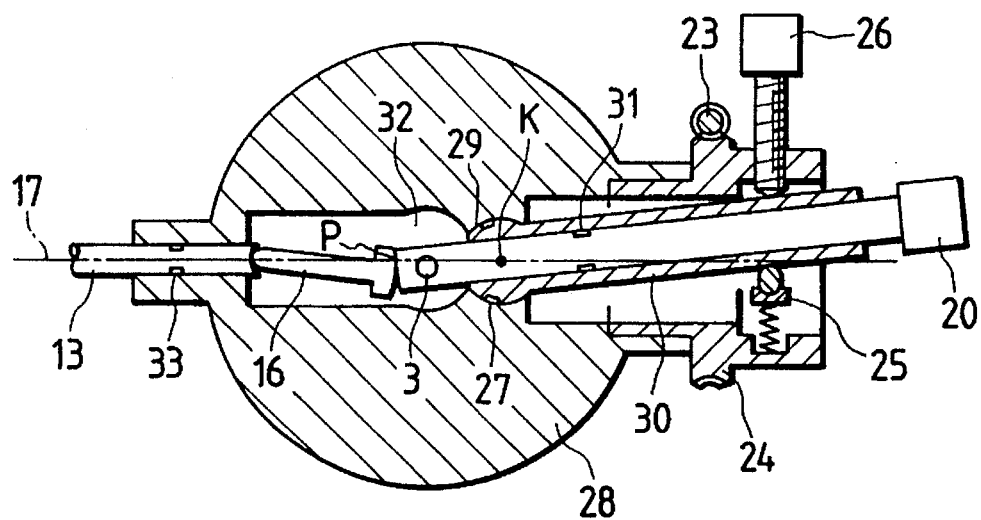
FIG. 3 is a schematic view showing an embodiment of a eucentric side entry goniometer stage.
Figure 4A:
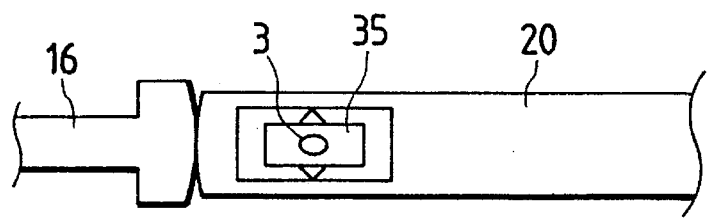
FIG. 4A is a schematic plan view showing the top end portion of a specimen holder shown in FIG. 3.
Figure 4B:
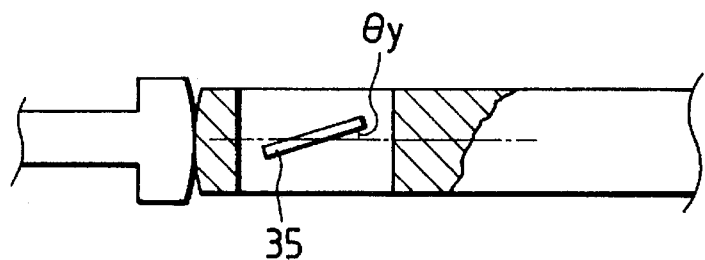
FIG. 4B is a schematic front view, partly in section, showing the top portion of a specimen holder shown in FIG. 3.

FIG. 2 is a flow chart showing an embodiment of the adjusting method for the position of specimen and the tilt angle of specimen in a eucentric side entry bi-axial-tilting fine motion device employing a method of correcting the shifting of view according to the present invention.

Finding a view is performed by operating the x-direction fine motion unit 6 and the y-direction fine motion unit 6' shown in FIG. 1. When the position in the y-direction of the observed point on the specimen is changed using the y-direction fine motion unit 6', the values $(\Delta z)_x$ and $\Delta z$ are calculated to correct the positions x and z according to the equation (7) and the equation (9), respectively. The coordinate x and the coordinate y of the observed point are sequentially displayed on the display unit 11 shown in FIG. 1. When the observed point is determined, focusing at that point is performed. Although the focusing is performed by operating the z-direction fine motion unit 7, the focusing may be automatically performed through calculation to obtain the contrast of the specimen image.

In a case where the tilt angle $\theta_x$ is changed, the specimen is tilted up to a desired tilt angle of $\theta_x$ by operating the specimen tilting operation unit 8, and at the same time the value of $\theta_x$ is stored and displayed. In a case where the tilt angle $\theta_y$ is changed following to the change in $\theta_x$, the specimen is tilted up to a desired tilt angle of $\theta_y$ by operating the specimen tilting operation unit 8', and at the same time the value of $\theta_y$ is stored and displayed.

It is preferable that the value $\theta_y$ and the accompanied values are adjusted in every very small amount of change in $\theta_y$ as follows. That is, the shifting of view is corrected step-by-step by finding the very small amount of change in $\theta_y$, and the specimen is tilted up to a desired value of $\theta_y$ by repeating this process. Let the amount of very small change be $\Delta\theta_y$. With the change by one step, the value $\theta_{y2}$ in the equation (11) and the equation (12) becomes $\theta_{y1}+\Delta\theta_y$, and the values $\Delta y$, $\Delta z$ in the equation (11) and the equation (12) are expressed by the following equations.

$$\Delta y = y_2\{1 - \cos(\theta_{y1} + \Delta\theta_y)/\cos\theta_{y1}\} \quad (13)$$
$$= y_2(1 - \cos\Delta\theta_y + \tan\theta_{y1} \cdot \sin\Delta\theta_y)$$
$$\Delta z = y_2\{\sin(\theta_{y1} + \Delta\theta_y) - \sin\theta_{y1}\}/\cos\theta_{y1} \quad (14)$$
$$= y_2\{\tan\theta_{y1}(\cos\Delta\theta_y - 1) + \sin\Delta\theta_y\}$$

Therefore, the correction is sequentially repeated according to the equations (13) and (14) while the value $\theta_y$ is changed by operating the operating unit 8'. In this case, the value $\theta_{y1}$ in the above equation expresses the value of $\theta_y$ just before changing the tilt angle $\theta_y$ by the very small amount of change $\Delta\theta_y$.

It often takes too long to obtain a calculated result when there are many trigonometric functions in the calculation depending on the capacity of a CPU used in the correction. In such a case, the above equations are approximated by expanding the trigonometric function by $\Delta\theta_y$ and omitting the terms higher than $\Delta\theta_y$ to the third power since the value $\Delta\theta_y$ is small, which leads to the following equations (15) and (16). By calculating the equations, the calculating speed is increased since the trigonometric function contained in the equations is only $\tan\theta_y$.

$$\Delta y = y_2\{(\Delta\theta_y/2)^2 + \tan\theta_{y1} \cdot \Delta\theta_y\} \quad (15)$$

$$\Delta z = y_2\{\tan\theta_{y1} \cdot (\Delta\theta_y/2)^2 + \Delta\theta_y\} \quad (16)$$

It is more convenient that the amount of the value $\Delta\theta_y$ is changed depending on the magnification of observing the specimen. That is, when observation is performed with a high magnification, an awkward motion in the observed image can be eliminated by setting a small value of $\Delta\theta_y$. And when observation is performed with a low magnification, the speed of the observation can be increased by setting a large value of $\Delta\theta_y$. In order to vary the amount of the value $\Delta\theta_y$ depending on the magnification of image observation, it is sufficient to add a step to vary the value $\Delta\theta_y$ depending on the magnification of image observation before the step to change $\theta_x$, $\theta_y$ shown in the flow chart of FIG. 2.

Of course, time is a related factor when the specimen is tilted. Although time is not explicitly expressed in the equations (13) to (16), it goes without saying that the value $\Delta\theta_y$ may be expressed as a function of time.

FIG. 7 is a timing chart showing an embodiment of correcting an image shifting when a specimen is tilted in the $\theta_y$-direction. When the switch 8' in FIG. 1 is turned on, the specimen starts to be tilted in the $\theta_y$-direction. Calculation $t_o$ for the correction and output and correction $t_o$ for the correction are executed every time period $t_1$. The correction period $t_1$ may be automatically varied in liking with the magnification of observed image. The correction period $t_1$ may be arbitrarily selected according to the magnification of observed image or the content of observation. After the switch 8' is turned off, at least one step of $t_1$ is performed before completion of substantial tilting operation in the $\theta_y$-direction. Other than such a process, it may be possible to tilt a specimen by setting angles $\theta_{x2}$, $\theta_{y2}$ to be tilted while correction of image shifting along the timing chart in the figure is being performed.

The reference character 11 in FIG. 1 indicates a display unit in the bi-axial-tilting specimen fine motion device. In the display unit 11, a CRT display or a liquid crystal display, and other numerical display tube may be used. In general, specimen positions (x, y) now and tilt angles ($\theta_x$, $\theta_y$) now are displayed in the display unit. However, since the specimen positions (x, y) now contain the amount of correcting part of image shifting due to tilting of the specimen as described above, the specimen position is not an actual position ($x_O$, $y_O$) (observed position when the specimen is not tilted) of the specimen which an operator is interested in. In the present invention, the actual position ($x_O$, $y_O$) is also displayed, or only the actual position ($x_O$, $y_O$) which the operator is interested in is also displayed.

The relationship between the coordinates (x, y) and the coordinates ($x_O$, $y_O$) is expressed by the following equations (17), (18) based on the equations (7) to (9) when the values $\theta_x$, $\theta_y$ are kept constant.

$$x_O = x + \Delta y \tan\theta_y \cdot \tan\theta_x \quad (17)$$

($\Delta y$ is amount of change in y)

$$y_O = y/\cos\theta_y \quad (18)$$

When the value x is changed in order to change a position to be observed in the x-direction, the value $x_O$ is also changed by that amount. When a position to be observed is changed in the y-direction by the amount $\Delta y$, the value $x_O$ cannot be changed. Therefore, the value x is corrected by the amount $\Delta y \tan\theta_y \cdot \tan\theta_x$, and the value $x_O$ is kept constant.

In a case where the position to be observed ($x_O$, $y_O$) is kept constant and the values $\theta_x$, $\theta_y$ are varied, the values $x_O$, x, $y_O$ do not change, but the value y changes according to the equation (18).

FIGS. 8A, 8B and 8C show embodiments of screens displaying positions of a specimen and tilt angles of a specimen. In these examples, the positions of a specimen are displayed in three-digit numbers, and the coordinates x, y for the point of origin are displayed by "0, 0, 0". By dividing the specimen between the point of origin and the edge of the specimen into 1000 regions in an equal spacing, each of the parts is indicated by number between ±999. Although the control of the specimen position using the CPU is much finer than the division of 1/1000, the numbers below the decimal point are displayed by rounding up the numbers of five and above and rounding down anything under five.

FIGS. 8A and 8B show changes in the screen of the display displaying x, y, $y_O$ in a case in which the values $\theta_x$, $\theta_y$ are kept constant and the value y is varied. The value y is indicated as 759, and the value $y_O$ is indicated as 991. That is, this indicates that the position being actually observed is a position very near the edge of the specimen. This is very convenient for an observer. FIGS. 8B and 8C show changes in the screen of the display in a case in which the values $x_O$, $y_O$ are kept constant and the values $\theta_x$, $\theta_y$ are varied.

In the past, in order to tilt a specimen up to a required tilt angle, an operator has to repeatedly stop operation of tilting the specimen to correct the shifting of image using a specimen fine motion device and then the specimen is again tilted. However, according to the present invention, image shifting when the specimen is tilted is automatically corrected. Therefore, such a complex operation is not required and the specimen is easily and speedily tilted up to a desired tilt angle.

Furthermore, the device becomes convenient by displaying the position of specimen $x_O$, $y_O$ (the position being observed which is the position of the specimen with the tilt angles are zero) in which an operator is interested.

What is claimed is:

1. A eucentric side entry bi-axial-tilting specimen fine motion device comprising:

a specimen holder movable forward and backward in a direction nearly perpendicular to an optical axis and universally pivotable and rotatable around a point of support positioned on the center axis of the specimen holder, a specimen table rotatable provided on said specimen holder, a specimen position and tilt angle controller, and a calculator;

where, in a coordinate system in which an axis intersecting the center axis of said specimen holder at a right angle on said specimen holder is the x-axis, an axis connecting an observed point positioned on said optical axis and said point of support and intersecting said optical axis at a right angle is the y-axis, an axis perpendicular to said x-axis and said y-axis is the z-axis, a tilt angle of said x-axis to the plane perpendicular to said optical axis is $\theta_x$, a tilt angle to the center axis of said specimen holder in said specimen table being rotatable around said x-axis is $\theta y$, a coordinate of said observed point having the intersecting point of the center axis of said specimen holder and said x-axis as the point of origin is (x, y, z);

a shifting of an observed image is automatically corrected by calculating correction values of image shifting $\Delta y$ and $\Delta z$ using said calculator based on the following equations and by shifting the observed point to a coordinates (x, y$-\Delta$y, z$-\Delta$z) using said specimen position and tilt angle controller when said tilt angle $\theta_y$ is varied from $\theta_{y1}$ to $\theta_{y2}$ $\Delta y = y(1 - \cos \theta_{y2}/\cos \theta_{y1})$ $\Delta z = y(\sin \theta_{y2} - \sin \theta_{y1})/\cos \theta_{y1})/\cos \theta_{y1}$.

2. A eucentric side entry bi-axial-tilting specimen fine motion device comprising:

a specimen holder movable forward and backward in a direction nearly perpendicular to an optical axis and universally pivotable and rotatable around a point of support positioned on the center axis of the specimen holder, a specimen table rotatable provided on said specimen holder, a specimen position and tilt angle controller, and a calculator;

where, in a coordinate system in which an axis intersecting the center axis of said specimen holder at right angle on said specimen holder is the x-axis, an axis connecting an observed point positioned on said optical axis and said point of support and intersecting said optical axis at right angle is the y-axis, an axis perpendicular to said x-axis and said y-axis is the z-axis, a tilt angle of said x-axis to the plane perpendicular to said optical axis is $\theta_x$, a tilt angle to the center axis of said specimen holder in said specimen table being rotatable around said x-axis is $\theta_y$, a coordinate of said observed point having the intersecting point of the center axis of said specimen holder and said x-axis as the point of origin is (x, y, z):

a shifting of an observed image is automatically corrected by calculating correction values of image shifting $\Delta y$ and $\Delta z$ using said calculator based on the following equations and by shifting the observed point to a coordinates (x, y$-\Delta$y, z$-\Delta$z) using said specimen position and tilt angle controller when said tilt angle $\theta y$ is varied by a very small value of change $\Delta \theta y$;

$\Delta y = y(1 - \cos (\theta_{y1} + \Delta\theta_y)/\cos \theta_{y1})$ $\Delta z = y(\sin (\theta_{y1} + \Delta\theta_y) - \sin \theta_{y1})/\cos \theta_{y1}$ wherein $\theta_{y1}$ is the value of $\theta_y$ just before changing the tilt angle $\theta_y$ by the very small value of change $\Delta\theta_y$.

3. A eucentric side entry bi-axial-tilting specimen fine motion device comprising:

a specimen holder movable forward and backward in the direction nearly perpendicular to an optical axis and universally pivotable and rotatable around a point of support positioned on the center axis of the specimen holder, a specimen table rotatable provided on said specimen holder, a specimen position and tilt angle controller, and a calculator;

where, in a coordinate system in which an axis intersecting the center axis of said specimen holder at right angle on said specimen holder is the x-axis, an axis connecting an observed point positioned on said optical axis and said point of support and intersecting said optical axis at right angle is the y-axis, an axis perpendicular to said x-axis and said y-axis is the z-axis, a tilt angle of said x-axis to the plane perpendicular to said optical axis is $\theta_x$, a tilt angle to the center axis of said specimen holder in said specimen table being rotatable around said x-axis is $\theta_y$, a coordinate of said observed point having the intersecting point of the center axis of said specimen holder and said x-axis as the point of origin is (x, y, z):

a shifting of observed image is automatically corrected by calculating correction values of image shifting $\Delta y$ and $\Delta z$ using said calculator based on the following equations and by shifting the observed point to a coordinates (x, y$-\Delta$y, z$-\Delta$z) using said specimen position and tilt angle controller when said tilt angle $\theta y$ is varied by a very small value of change $\Delta\theta y$;

$\Delta y = y(1 - \cos \Delta\theta_y + \tan \theta_{y1} \cdot \sin \Delta\theta_y)$ $\Delta z = y\{\tan \theta_{y1}(\cos \Delta\theta_y - 1) + \sin \Delta\theta y\}$ wherein $\theta_{y1}$ is the value of $\theta_y$ just before changing the tilt angle $\theta_y$ by the very small value of change $\Delta\theta_y$.

4. A eucentric side entry bi-axial-tilting specimen fine motion device comprising:

a specimen holder movable forward and backward in the direction nearly perpendicular to an optical axis and universally pivotable and rotatable around a point of support positioned on the center axis of the specimen holder, a specimen table rotatable provided on said specimen holder, a specimen position and tilt angle controller, and a calculator;

where, in a coordinate system in which an axis intersecting the center axis of said specimen holder at right angle on said specimen holder is the x-axis, an axis connecting an observed point positioned on said optical axis and said point of support and intersecting said optical axis at right angle is the y-axis, an axis perpendicular to said x-axis and said y-axis is the z-axis, a tilt angle of said x-axis to the plane perpendicular to said optical axis is $\theta_x$, a tilt angle to the center axis of said specimen holder in said specimen table being rotatable around said x-axis is $\theta_y$, a coordinate of said observed point having the intersecting point of the center axis of said specimen holder and said x-axis as the point of origin is (x, y, z):

a shifting of an observed image is automatically corrected by calculating correction values of image shifting $\Delta y$ and $\Delta z$ using said calculator based on the following equations and by shifting the observed point to a coordinates $(x, y-\Delta y, z-\Delta z)$ using said specimen position and tilt angle controller when said tilt angle $\theta y$ is varied by a very small value of change $\Delta\theta y$;

$$\Delta y = y\{(\Delta\theta_y/2)^2 + \tan\theta_{y1} \cdot \Delta\theta_y\}$$

$$\Delta z = y\{\tan\theta_{y1} \cdot (\Delta\theta/2)^2 + \Delta\theta_y\}$$

wherein $\theta_{y1}$ is the value of $\theta_y$ just before changing the tilt angle $\theta_y$ by the very small value of change $\Delta\theta_y$.

5. A eucentric side entry bi-axial-tilting specimen fine motion device according to any one of claim 1 to claim 4, which further comprises a display to show the coordinates and the tile angles in the observed point of the specimen, said display having display portions for the x-coordinate and the y-coordinate of said observed point when both of the tile angles $\theta_x$ and $\theta_y$ are zero degree.

6. A method of correcting image shifting in a eucentric side entry bi-axial-tilting specimen fine motion device capable of controlling the coordinates (x, y, z) of an observed point to an x-axis intersecting the center axis of a specimen holder universally pivotable around a point of support on the point of origin at right angle, a y-axis connecting said observed point positioned on an optical axis and said point of support and intersecting said optical axis at right angle, a z-axis intersecting said x-axis and said y-axis at right angles; and a tilt angle $\theta_x$ of said x-axis to the plane perpendicular to said optical axis; a tilt angle $\theta_y$ to the center axis of said specimen holder containing a specimen table being rotatable around said x-axis; wherein coordinates of said observed point to said point of origin are (x, y, z) said method comprising the steps of:

calculating correction values of image shifting $\Delta y$ and $\Delta z$ using a calculator based on the following equations, and automatically shifting the observed point to a coordinates $(x, y-\Delta y, z-\Delta z)$ using a specimen position and tilt angle controller when said tilt angle $\theta_y$ is varied from $\theta_{y1}$ to $\theta_{y2}$:

$$\Delta y = y(1 - \cos\theta_{y2}/\cos\theta_{y1})$$

$$\Delta z = y(\sin\theta_{y2} - \sin\theta_{y1})/\cos\theta_{y1}.$$

7. A method of correcting image shifting in a eucentric side entry bi-axial-tilting specimen fine motion device capable of controlling the coordinates (x, y, z) of an observed point to an x-axis intersecting the center axis of a specimen holder universally pivotable around a point of support on the point of origin at right angle, a y-axis connecting said observed point positioned on an optical axis and said point of support and intersecting said optical axis at right angle, a z-axis intersecting said x-axis and said y-axis at right angles; and a tilt angle $\theta_x$ of said x-axis to the plane perpendicular to said optical axis; a tilt angle $\theta_y$ to the center axis of said specimen holder containing a specimen table being rotatable around said x-axis; wherein coordinates of said observed point to said point of origin are (x, y, z), said method comprising the steps of:

calculating correction values of image shifting $\Delta y$ and $\Delta z$ using a calculator based on the following equations, and automatically shifting the observed point to a coordinates $(x, y-\Delta y, z-\Delta z)$ using a specimen position and tilt angle controller when said tilt angle $\theta_y$ is varied from $\theta_{y1}$ to $\theta_{y2}$;

$$\Delta y = y(1 - \cos(\theta_{y1} + \Delta\theta_y)/\cos\theta_{y1})$$

$$\Delta z = y(\sin(\theta_{y1} + \Delta\theta_y) - \sin\theta_{y1})/\cos\theta_{y1}$$

wherein $\theta_{y1}$ is the value of $\theta_y$ just before changing the tilt angle $\theta_y$ by a very small value of change $\Delta\theta_y$.

8. A method of correcting image shifting in a eucentric side entry bi-axial-tilting specimen fine motion device capable of controlling the coordinates (x, y, z) of an observed point to an x-axis intersecting the center axis of a specimen holder universally pivotable around a point of support on the point of origin at right angle, a y-axis connecting said observed point positioned on said optical axis and said point of support and intersecting an optical axis at right angle, a z-axis intersecting said x-axis and said y-axis at right angles; and a tilt angle $\theta_x$ of said x-axis to the plane perpendicular to said optical axis; a tilt angle $\theta_y$ to the center axis of said specimen holder containing a specimen table being rotatable around said x-axis; wherein coordinates of said observed point to said point of origin are (x, y, z), said method comprising the steps of:

calculating correction values of image shifting $\Delta y$ and $\Delta z$ using a calculator based on the following equations, and automatically shifting the observed point to a coordinates $(x, y-\Delta y, z-\Delta z)$ using a specimen position and tilt angle controller when said tilt angle $\theta_y$ is varied from $\theta_{y1}$ to $\theta_{y2}$;

$$\Delta y = y(1 - \cos\Delta\theta_y + \tan\theta_{y1} \cdot \sin\Delta\theta_y)$$

$$\Delta z = y\{\tan\theta_{y1}(\cos\Delta\theta_y - 1) + \sin\theta_y\}$$

wherein $\theta_{y1}$ is the value of $\theta_y$ just before changing the tilt angle $\theta_y$ by a very small value of change $\Delta\theta_y$.

9. A method of correcting image shifting in a eucentric side entry bi-axial-tilting specimen fine motion device capable of controlling the coordinates (x, y, z) of an observed point to an-axis intersecting the center axis of a specimen holder universally pivotable around a point of support on the point of origin at right angle, a y-axis connecting said observed point positioned on an optical axis and said point of support and intersecting said optical axis at right angle, a z-axis intersecting said x-axis and said y-axis at right angles; and a tilt angle $\theta_x$ of said x-axis to the plane perpendicular to said optical axis; a tilt angle $\theta_y$ to the center axis of said specimen holder containing a specimen table being rotatable around said x-axis; wherein coordinates of said observed point to said point of origin are (x, y, z), said method comprising the steps of:

calculating correction values of image shifting $\Delta y$ and $\Delta z$ using a calculator based on the following equations, and automatically shifting the observed point to a coordinates $(x, y-\Delta y, z-\Delta z)$ using a specimen position and tilt controller when said tilt angle $\theta_y$ is varied from $\theta_{y1}$ to $\theta_{y2}$;

$$\Delta y = y\{(\Delta\theta_y/2)^2 + \tan\theta_{y1} \cdot \Delta\theta_y\}$$

$$\Delta z = y\{\tan\theta_{y1} \cdot (\Delta\theta_y/2)^2 + \Delta\theta_y\}$$

wherein $\theta_{y1}$ is the value of $\theta_y$ just before changing the tilt angle $\theta_y$ by a very small value of change $\Delta\theta_y$.

10. In a method of adjusting a specimen position using a eucentric side entry bi-axial-tilting specimen fine motion device capable of controlling the coordinates (x, y, z) of an observed point to an x-axis intersecting the center axis of a specimen holder universally pivotable around a point of support on the point of origin at right angle, a y-axis connecting said observed point positioned on an optical axis and said point of support and intersecting said optical axis at right angle, a z-axis intersecting said x-axis and said y-axis at right angles; and a tilt angle $\theta_x$ of said x-axis to the plane perpendicular to said optical axis; a tilt angle $\theta_y$ to the center axis of said specimen holder containing a specimen table being rotatable around said x-axis; wherein coordinates of said observed point to said point of origin are (x, y, z), said method comprising the steps of:

changing an x-coordinate position of the observed point of a specimen to a desired position and storing and displaying the value of the x-coordinate;

changing a y-coordinate position of the observed point of the specimen to a desired position and storing and displaying the value of the y-coordinate;

adjusting a z-coordinate position of the observed point of the specimen to focus on the observed point; changing the tilt angle $\theta_x$ and storing and displaying the value of the z-coordinate; changing the tilt angle $\theta_y$ by a very small value of change $\Delta\theta_y$; and shifting an observed image automatically corrected by calculating correction values of image shifting $\Delta y$ and $\Delta z$ using a calculator based on the following equations, and automatically shifting the observed point to a coordinates $(x, y-\Delta y, z-\Delta z)$ using a specimen position and tilt angle controller when said tilt angle $\theta_y$ is varied from $\theta_{y1}$ to $\theta_{y2}$:

$$\Delta y = y(1 - \cos 74_{y2}/\cos\theta_{y1})$$

$$\Delta z = y(\sin\theta_{y2} - \sin\theta_{y1})/\cos\theta_{y1}.$$

* * * * *

UNITED STATES PATENT AND TRADEMARK OFFICE
CERTIFICATE OF CORRECTION

PATENT NO. : 5,591,980                    Page 1 of 3
DATED      : January 7, 1997
INVENTOR(S): Mitsuo OGASAWARA et al.

It is certified that error appears in the above-indentified patent and that said Letters Patent is hereby corrected as shown below:

| Column | Line | |
|---|---|---|
| 3 | 42 | Before "where" delete "of". |
| 5 | 54 | Change "$z_0$" to --$z_o$--. |
| 5 | 55 | Change "$(x_0, y_0)$" to --$(x_o, y_o)$--. |
| 6 | 7  | Change "$y_0$" to --$y_o$--. |
| 8 | 8  | Change "$t_0$" to --$t_c$--. |
| 8 | 9  | Change "$t_0$" to --$t_o$--. |
| 8 | 28 | Change "$x_0$" to --$x_o$--. |
| 8 | 29 | Change "$y_0$" to --$y_o$--. |
| 8 | 31 | Change "$(x_0, y_0)$" to --$(x_o, y_o)$--. |
| 8 | 32 | Change "$(x_0, y_0)$" to --$(x_o, y_o)$--. |
| 8 | 35 | Change "$(x_0, y_0)$" to --$(x_o, y_o)$--. |
| 8 | 39 | Change "$x_0$" to --$x_o$--. |
| 8 | 43 | Change "$y_0$" to --$y_o$--. |

UNITED STATES PATENT AND TRADEMARK OFFICE
CERTIFICATE OF CORRECTION

PATENT NO. : 5,591,980

DATED : January 7, 1997

INVENTOR(S) : Mitsuo OGASAWARA et al.

It is certified that error appears in the above-indentified patent and that said Letters Patent is hereby corrected as shown below:

| Column | Line | |
|---|---|---|
| 8 | 45 | Change "$x_0$" to --$x_o$--. |
| 8 | 47 | Change "$x_0$" to --$x_o$--. |
| 8 | 49 | Change "$x_0$" to --$x_o$--. |
| 8 | 50 | Change "$(x_0, y_0)$" to --$(x_o, y_o)$--. |
| 8 | 52 | Change "$x_0$" to --$x_o$--. |
| 8 | 53 | Change "$y_0$" to --$y_o$--. |
| 8 | 67 | Change "$y_0$" to --$y_o$--. |
| 9 | 2 | Change "$y_0$" to --$y_o$--. |
| 9 | 6 | Change "$x_0$" to --$x_o$--. |
| 9 | 7 | Change "$y_0$" to --$y_o$--. |
| 9 | 17 | Change "$(x_0, y_0)$" to --$(x_o, y_o)$--. |

UNITED STATES PATENT AND TRADEMARK OFFICE
CERTIFICATE OF CORRECTION

PATENT NO. : 5,591,980
DATED : January 7, 1997
INVENTOR(S) : Mitsuo OGASAWARA et al.

Page 3 of 3

It is certified that error appears in the above-indentified patent and that said Letters Patent is hereby corrected as shown below:

| Column | Line | |
|---|---|---|
| 9 | 57 | Delete ")/cos $\theta_{y1}$". |
| 10 | 26 | After "cos" (first occurrence) insert --(-- |
| 14 | 30 | Change "cos 74" to --cos $\theta$--. |

Signed and Sealed this

Fifteenth Day of July, 1997

Attest:

BRUCE LEHMAN

Attesting Officer

Commissioner of Patents and Trademarks